US011791309B2

(12) United States Patent
Pun et al.

(10) Patent No.: US 11,791,309 B2
(45) Date of Patent: Oct. 17, 2023

(54) PROCESS FOR ELECTRICALLY CONNECTING CONTACT SURFACES OF ELECTRONIC COMPONENTS

(71) Applicant: Heraeus Materials Singapore Pte. Ltd., Singapore (SG)

(72) Inventors: Yean Mee Pun, Singapore (SG); Murali Sarangapani, Singapore (SG); Xi Zhang, Singapore (SG); Il Tae Kang, Incheon (KR); Abito Danila Bayaras, Singapore (SG); Kim Hui Chong, Singapore (SG); Sylvia Sutiono, Singapore (SG); Chee Wei Tok, Singapore (SG); Tae Yeop James Kim, Gyeonggi-Do (SG)

(73) Assignee: HERAEUS MATERIALS SINGAPORE PTE. LTD., Singapore (SG)

( * ) Notice: Subject to any disclaimer, the term of this patent is extended or adjusted under 35 U.S.C. 154(b) by 302 days.

(21) Appl. No.: 17/309,506

(22) PCT Filed: Dec. 12, 2018

(86) PCT No.: PCT/SG2018/050609
§ 371 (c)(1),
(2) Date: Jun. 2, 2021

(87) PCT Pub. No.: WO2020/122809
PCT Pub. Date: Jun. 18, 2020

(65) Prior Publication Data
US 2022/0037284 A1 Feb. 3, 2022

(51) Int. Cl.
*B23K 20/00* (2006.01)
*H01L 23/00* (2006.01)

(52) U.S. Cl.
CPC .......... *H01L 24/85* (2013.01); *B23K 20/005* (2013.01); *H01L 24/45* (2013.01); *H01L 2224/45015* (2013.01); *H01L 2224/45139* (2013.01); *H01L 2224/45572* (2013.01); *H01L 2224/45644* (2013.01); *H01L 2224/45655* (2013.01); *H01L 2224/45664* (2013.01); *H01L 2224/85181* (2013.01); *H01L 2224/85205* (2013.01)

(58) Field of Classification Search
CPC ........... H01L 24/78; H01L 2224/45015; H01L 2224/45139; H01L 2224/73265; H01L 2224/78301; H01L 24/45; H01L 24/48; H01L 2224/78313; H01L 2225/0651; B23K 20/004; B23K 20/10; B23K 20/005; B23K 2101/40; B23K 20/007
See application file for complete search history.

(56) References Cited

U.S. PATENT DOCUMENTS

| | | | |
|---|---|---|---|
| 5,897,049 A * | 4/1999 | Nakamura | H01L 24/48 219/56.22 |
| 9,059,003 B2 | 6/2015 | Tatsumi et al. | |
| 9,337,166 B2 | 5/2016 | Hagiwara et al. | |
| 9,793,236 B2 | 10/2017 | Sekine et al. | |
| 9,899,348 B2 * | 2/2018 | Sekine | B23K 20/004 |
| 2005/0167473 A1 | 8/2005 | Mayer et al. | |
| 2007/0015353 A1 * | 1/2007 | Craig | H01L 24/80 438/617 |
| 2007/0231959 A1 | 10/2007 | Seidel et al. | |
| 2012/0032354 A1 | 2/2012 | Pham et al. | |
| 2014/0327018 A1 | 11/2014 | Tatsumi et al. | |
| 2015/0187729 A1 | 7/2015 | Chew | |
| 2015/0246411 A1 * | 9/2015 | Sekine | H01L 24/78 228/9 |
| 2015/0249063 A1 | 9/2015 | Sekine et al. | |
| 2016/0351538 A1 * | 12/2016 | Hagiwara | H01L 24/78 |
| 2018/0345421 A1 | 12/2018 | Kang et al. | |
| 2019/0181072 A1 * | 6/2019 | Shojaie | H01L 24/48 |
| 2021/0283141 A1 | 9/2021 | Masterson et al. | |

FOREIGN PATENT DOCUMENTS

| | | |
|---|---|---|
| CN | 106086962 A | 11/2016 |
| EP | 0791955 A2 | 8/1997 |
| JP | 2012256861 A | 12/2012 |
| TW | 201430976 A | 8/2014 |
| TW | 201602366 A | 1/2016 |
| WO | WO-2017091144 A1 | 6/2017 |
| WO | WO-2017123153 A2 | 7/2017 |

OTHER PUBLICATIONS

Supplementary European Search Report issued in EP18943187 dated Nov. 23, 2021.
International Search Report issued in PCT/SG2018/050609 dated Mar. 6, 2019.
"Gaiser® Precision Bonding Tools Product Catalog" by CoorsTek, Inc., 2015 (6 pages).

* cited by examiner

*Primary Examiner* — Erin B Saad
(74) *Attorney, Agent, or Firm* — Blank Rome LLP

(57) ABSTRACT

A process for electrically connecting contact surfaces of electronic components by capillary wedge bonding a round wire of 8 to 80 μm to the contact surface of a first electronic component, forming a wire loop, and stitch bonding the wire to the contact surface of a second electronic component, wherein the wire comprises a wire core having a silver or silver-based wire core with a double-layered coating comprised of a 1 to 50 nm thick inner layer of nickel or palladium and an adjacent 5 to 200 nm thick outer layer of gold.

19 Claims, No Drawings

PROCESS FOR ELECTRICALLY CONNECTING CONTACT SURFACES OF ELECTRONIC COMPONENTS

This application is a national stage of International Patent Application No. PCT/SG2018/050609, filed Dec. 12, 2018, the entire contents of which is incorporated by reference herein.

The invention relates to a process for electrically connecting contact surfaces of electronic components by a coated wire comprising a silver or silver-based core and a double-layered coating superimposed on the surface of the core.

Wire bonding technique is well known to the skilled person. In the course of wire bonding a first bond is formed on the contact surface of a first electronic component and a second bond on the contact surface of a second electronic component. Both bonds are the terminals of the piece of connecting bonding wire in between.

The term "electronic component" is used herein. Here, in this context, the term "electronic component" shall include substrates and semiconductors as are used in the electronics or microelectronics area. Examples of substrates include lead frames, BGAs (ball grid arrays), PCB (printed circuit boards), flexible electronics, glass substrates, ceramic substrates like for example DAB (direct aluminum bonded) or DCB (direct copper bonded) substrates, and IMS (insulated metal substrates). Examples of semiconductors include diodes, LEDs (light emitting diodes), dies, IGBTs (insulated gate bipolar transistors), ICs (integrated circuits), MOSFETs (metal oxide semiconductor field effect transistors) and sensors.

The term "contact surface" is used herein. It means the electrical contact surface of an electronic component to which a bonding wire can be connected by means of wire bonding. Typical examples are bond pads of semiconductors and contact surfaces (e.g. plated fingers, plated grounds) of substrates. Bond pads may consist of a metal or a metal alloy or they may have a thin, for example, 0.5 to 1 µm thin top layer of a certain metal or metal alloy. They may have a surface of aluminum, copper, nickel, silver, gold or of an alloy based on one of these metals, for example. The bond pads may have an overall thickness of, for example, 0.6 to 4 µm and an area of, for example, 20 µm×20 µm to 300 µm×300 µm, preferably 35 µm×35 µm to 125 µm×125 µm.

The use of bonding wires in electronics and microelectronics applications is well-known state of the art. While bonding wires were made from gold in the beginning, nowadays less expensive materials are used such as copper, copper alloys, silver and silver alloys. Such wires may have a metal coating.

With respect to wire geometry, most common are bonding wires of circular cross-section.

A routine fine wire bonding technique well-known by the skilled person is ball-wedge wire bonding (="ball-wedge bonding" for short), in the course of which a ball bond ($1^{st}$ bond) and a stitch bond ($2^{nd}$ bond, wedge bond) are formed.

Recently, a fine wire bonding technique has been reported, in which said first ball bonding step is replaced by a so-called capillary wedge bonding step, see for example, the disclosure in the article "Aluminum Wedge-Wedge Bonding Using Capillary and Ball Bonder" written by Sarangapani Murali et al., IMAPS 2017—$50^{th}$ International symposium on Microelectronics—Raleigh NC USA, Oct. 9-12, 2017. That type of fine wire bonding process is distinguished by the formation of a capillary wedge bond ($1^{st}$ wedge bond) and a conventional stitch bond ($2^{nd}$ wedge bond).

Capillary wedge bonding omits wire ball or FAB (free air ball) formation at the wire tip as is typical in ball bonding. Capillary wedge bonding improves productivity compared to ball bonding especially with respect to so-called cascade wire bonding, also often denoted as step wire bonding (wire bonding in stacked-die applications).

US 2015/0187729 A1 discloses capillary wedge bonding of gold wires, copper wires and aluminum wires.

WO 2017/091144 A1 discloses bonding wires comprising a silver or silver-based wire core having a coating layer superimposed on its surface, wherein the coating layer is a 1 to 1000 nm single-layer of gold or palladium or a double-layer comprised of a 1 to 100 nm, preferably 1 to 20 nm thick inner layer of nickel or palladium and an adjacent 1 to 200 nm, preferably 1 to 40 nm thick outer layer of gold.

Applicant has found that a specific type of coated silver wire or coated silver-based wire is unexpectedly well suited for use as a bonding wire in $1^{st}$ capillary wedge/$2^{nd}$ stitch wire bonding applications with a focus on the $1^{st}$ capillary wedge wire bonding step; i.e. said $1^{st}$ capillary wedge wire bonding step if carried out with said specific type of a coated silver wire or of a coated silver-based wire has been found to be distinguished by an unexpectedly wide capillary wedge bonding process window.

Just like other wire bonding processes, capillary wedge bonding exhibits a so-called process window. Such capillary wedge bonding process window is explained further below.

The above mentioned specific type of coated silver wire or coated silver-based wire comprises a wire core with a surface, the wire core having a double-layered coating superimposed on its surface, wherein the wire core itself consists of a material selected from the group consisting of pure silver, doped silver with a silver content of >99.5 wt.-% (weight-%, % by weight) and silver alloys with a silver content of at least 89 wt.-%, and wherein the double-layered coating is comprised of a 1 to 50 nm thick inner layer of nickel or palladium and an adjacent 5 to 200 nm thick outer layer of gold.

Hence, the invention relates to a process for electrically connecting a contact surface of a first electronic component with a contact surface of a second electronic component comprising the subsequent steps:

(1) capillary wedge bonding a wire having a circular cross-section with an average diameter in the range of 8 to 80 µm to the contact surface of the first electronic component, (2) raising the capillary wedge bonded wire to form a wire loop between the capillary wedge bond formed in step (1) and the contact surface of the second electronic component, and (3) stitch bonding the wire to the contact surface of the second electronic component, wherein the capillary wedge bonding of step (1) is carried out with a ceramic capillary having a lower face angle within the range of from zero to 4 degrees, wherein the wire comprises a wire core with a surface, the wire core having a double-layered coating superimposed on its surface, wherein the wire core itself consists of a material selected from the group consisting of pure silver, doped silver with a silver content of >99.5 wt.-% and silver alloys with a silver content of at least 89 wt.-%, and wherein the double-layered coating is comprised of a 1 to 50 nm thick inner layer of nickel or palladium and an adjacent 5 to 200 nm thick outer layer of gold.

In step (1) of the process of the invention a wire is capillary wedge bonded to the contact surface of a first electronic component. In this step (1) a ceramic capillary having a lower face angle within the range of from zero to 4 degrees is employed as bonding tool.

The ceramic capillary supplies ultrasonic energy and compressive force. Examples of ceramic capillaries include capillaries of alumina or zirconia doped alumina.

The capillary wedge bonding of step (1) may be performed with conventional wedge bonding equipment, examples of which include a KNS bonder like the KNS-iConn bonder (Kulicke & Soffa Industries Inc., Fort Washington, PA, USA) or a Shinkawa bonder like the Shinkawa-UTC-5000, NeoCu bonder, Japan.

It is preferred that the capillary wedge bonding process parameters of step (1) include at least one, preferably more than one, and most preferably all of (a) to (i):
(a) ultrasonic energy in a range of 50 to 100 mA,
(b) force (compressive force) in a range of 10 to 30 g,
(c) constant velocity in a range of 0.3 to 0.7 μm/s; constant velocity means the speed at which the wire contacts a bond pad
(d) contact threshold in a range of 60 to 70%; contact threshold is a parameter that controls the sensitivity of the bond head in detecting contact with a bond pad or a contact surface, measured in percentage drop of contact velocity (KNS terminology, i.e. if KNS-iConn bonder is employed) or search speed (Shinkawa terminology, i.e. if Shinkawa bonder is employed),
(e) bonding temperature in a range of 25 to 175° C.,
(f) cut tail length (Shinkawa terminology, i.e. if Shinkawa bonder is employed) in a range of 85 to 110 μm,
(g) tail length extension (KNS terminology, i.e. if KNS-iConn bonder is employed) in a range of 200 to 500 μm,
(h) sink amount (Shinkawa terminology, i.e. if Shinkawa bonder is employed) in a range of −6 to −12 μm; sink amount is a process parameter which controls the mechanical deformation of the wire induced by ultrasonic energy and compressive force through the capillary tip; the wire deformation is measured in μm as downward deformation with reference to wire surface, denoted as a negative value,
(i) ultrasonic ramp (KNS terminology, i.e. if KNS-iConn bonder is employed) or ultrasonic sloping (Shinkawa terminology, i.e. if Shinkawa bonder is employed) in a range of 0 to 50%.

In other words, in case step (1) is carried out with a KNS-iConn bonder it is preferred that the capillary wedge bonding process parameters of step (1) include at least one, preferably more than one, and most preferably all of (a') to (g'):
(a') ultrasonic energy in a range of 50 to 100 mA,
(b') force in a range of 10 to 30 g,
(c') constant velocity in a range of 0.3 to 0.7 μm/s,
(d') contact threshold in a range of 60 to 70%,
(e') bonding temperature in a range of 25 to 175° C.,
(f') tail length extension in a range of 200 to 500 μm,
(g') ultrasonic ramp in a range of 0 to 50%,
whereas in case step (1) is carried out with a Shinkawa bonder it is preferred that the capillary wedge bonding process parameters of step (1) include at least one, preferably more than one, and most preferably all of (a") to (h"):

(a") ultrasonic energy in a range of 50 to 100 mA,
(b") force in a range of 10 to 30 g,
(c") constant velocity in a range of 0.3 to 0.7 μm/s,
(d") contact threshold in a range of 60 to 70%,
(e") bonding temperature in a range of 25 to 175° C.,
(f") cut tail length in a range of 85 to 110 μm,
(g") sink amount in a range of −6 to −12 μm,
(h") ultrasonic sloping in a range of 0 to 50%.

The capillary wedge bonding of step (1) exhibits a so-called capillary wedge bonding process window, which can be described by several different approaches, three of which are explained in the following.

In a first approach, capillary wedge bond forming is regarded to comprise application of a certain compressive force (typically measured in grams), supported by application of ultrasonic energy (typically measured in mA). The mathematical product of the difference between the upper and the lower limits of the applied force and the difference between the upper and the lower limits of the applied ultrasonic energy in a capillary wedge bonding process may here define the capillary wedge bonding process window:

(Upper limit of applied force−Lower limit of applied force)−(Upper limit of applied ultrasonic energy−Lower limit of applied ultrasonic energy)=Capillary Wedge bonding process window.

In a second approach, capillary wedge bond forming is regarded to comprise application of a certain force (typically measured in grams), supported by sink amount. The mathematical product of the difference between the upper and the lower limits of the applied force and the difference between the upper and the lower limits of the sink amount in a capillary wedge bonding process may here define the capillary wedge bonding process window:

(Upper limit of applied force−Lower limit of applied force)−(Absolute value of the upper limit of sink amount−Absolute value of the lower limit of sink amount)=Capillary Wedge bonding process window.

In a third approach, capillary wedge bond forming is regarded to comprise application of a certain force (typically measured in grams), supported by scrub amplitude. Scrub amplitude is a process parameter that controls mechanical motion (circular, perpendicular, inline (along the wire axis)) of the capillary tip consequently deforming the wire to a horse-shoe morphology thinning wire section. Scrub amplitude is typically measured in μm. The mathematical product of the difference between the upper and the lower limits of the applied force and the difference between the upper and the lower limits of the scrub amplitude in a capillary wedge bonding process may here define the capillary wedge bonding process window:

(Upper limit of applied force−Lower limit of applied force)−(Upper limit of scrub amplitude−Lower limit of scrub amplitude)=Capillary Wedge bonding process window.

Hence, the capillary wedge bonding process window defines the area of force/ultrasonic energy combinations or the area of force/sink amount combinations or the area of force/scrub amplitude combinations which allow formation of a wire bond that meets specifications, i.e. which passes the conventional tests like conventional pull tests.

For industrial applications it is desirable to have a wide capillary wedge bonding process window (force in g versus ultrasonic energy in mA or force in g versus sink amount in μm or force in g versus scrub amplitude in μm) for reasons of capillary wedge bonding process robustness. The process of the invention or, to be more precise, step (1) of the process of the invention is distinguished by an unexpectedly wide capillary wedge bonding process window. It appears that the coating of the wire is key for the unexpectedly wide capillary wedge bonding process window.

The wire used in the process of the invention is a round bonding wire for bonding in microelectronics. It is preferably a one-piece object. The average diameter is in the range of 8 to 80 μm or preferably 12 to 55 μm or even 17 to 50 μm.

The average diameter or, simply stated, the diameter of a wire or wire core can be obtained by the "sizing method". According to this method the physical weight of the wire for a defined length is determined. Based on this weight, the diameter of a wire or wire core is calculated using the density of the wire material. The diameter is calculated as arithmetic mean of five measurements on five cuts of a particular wire.

It is important that the wire comprises a wire core with a surface, the wire core having a double-layered coating superimposed on its surface, wherein the wire core itself consists of a material selected from the group consisting of pure silver, doped silver with a silver content of >99.5 wt.-% and silver alloys with a silver content of at least 89 wt.-%, and wherein the double-layered coating is comprised of a 1 to 50 nm thick inner layer of nickel or palladium and an adjacent 5 to 200 nm thick outer layer of gold. For brevity, this coated wire is also called "wire" herein for short.

The term "pure silver" is used herein. It shall mean silver having a purity in the range of from 99.95 to 100 wt.-%. It may comprise further components (components other than silver) in a total amount of up to 500 wt.-ppm (weight-ppm, ppm by weight).

The term "doped silver" is used herein. It shall mean a silver type consisting of silver in an amount in the range of from >99.5 to 99.997 wt.-% and at least one doping element in a total amount of up to <5000 wt.-ppm, for example, of from 30 to <5000 wt.-ppm. It may comprise further components (components other than silver and the at least one doping element) in a total amount of up to 500 wt.-ppm.

The term "silver alloy" is used herein. It shall mean an alloy consisting of silver in an amount in the range of from 89 to 99.50 wt.-% and at least one alloying element in a total amount of from 0.50 to 11 wt.-%, preferably consisting of silver in an amount in the range of from 92 to 99.50 wt.-% and at least one alloying element in a total amount of from 0.50 to 8 wt.-% or even in the range of from 96 to 99.50 wt.-% and at least one alloying element in a total amount of from 0.50 to 4 wt.-%. It may comprise at least one doping element (other than the at least one alloying element) in a total amount of up to <5000 wt.-ppm, for example, of from 30 to <5000 wt.-ppm. It may comprise further components (components other than silver, the at least one alloying element and the at least one doping element) in a total amount of up to 500 wt.-ppm.

Examples of preferred alloying elements include palladium, gold, nickel, platinum, copper, rhodium and ruthenium.

Examples of preferred doping elements include calcium, nickel, platinum, copper, rhodium and ruthenium.

As already mentioned, the core of the wire may comprise so-called further components in a total amount of up to 500 wt.-ppm. The further components, often also referred as "inevitable impurities", are minor amounts of chemical elements and/or compounds which originate from impurities present in the raw materials used or from the wire manufacturing process. The low total amount of 0 to 500 wt.-ppm of the further components ensures a good reproducibility of the wire properties. Further components present in the core are usually not added separately. Each individual further component may be comprised in an amount of less than 30 wt.-ppm, preferably less than 15 wt.-ppm, based on the total weight of the wire core.

In line with the aforementioned, the wire core consists of pure silver, of doped silver, or of a silver alloy.

The core of the wire is a homogeneous region of bulk material. Since any bulk material always has a surface region which might exhibit different properties to some extent, the properties of the core of the wire are understood as properties of the homogeneous region of bulk material. The surface of the bulk material region can differ in terms of morphology, composition (e.g. sulfur, chlorine and/or oxygen content) and other features. The surface is an interface region between the wire core and the double-layered coating superimposed on the wire core. Typically, the double-layered coating is completely superimposed on the wire core's surface. In the region of the wire between its core and the double-layered coating superimposed thereon a combination of materials of both, the core and the double-layered coating, can be present.

The double-layered coating superimposed on the surface of the wire is comprised of a 1 to 50 nm, preferably 1 to 20 nm thick inner layer of nickel or palladium and an adjacent 5 to 200 nm, preferably 10 to 100 nm thick outer layer of gold. In this context the term "thick" or "coating layer thickness" means the size of the coating layer in perpendicular direction to the longitudinal axis of the core.

Concerning the composition of said double-layered coating, the nickel or the palladium content of its inner layer is, for example, at least 50 wt.-%, preferably at least 95 wt.-%, based on the total weight of the inner coating layer. Particularly preferred, the inner coating layer consists of pure nickel or palladium. Pure nickel or palladium usually has less than 1 wt.-% of further components (components other than the nickel or the palladium), based on the total weight of the inner coating layer. The gold content of the adjacent outer gold layer is, for example, at least 50 wt.-%, preferably at least 95 wt.-%, based on the total weight of the outer coating layer. Particularly preferred, the outer coating layer consists of pure gold. Pure gold usually has less than 1 wt.-% of further components (components other than gold), based on the total weight of the outer coating layer.

In an embodiment, the wire is characterized at least by one of the following extrinsic properties ($\alpha$) to ($\theta$):

($\alpha$) The corrosion resistance has a value of not more than 5% capillary wedge lift, for example in the range of from 0 to 5% (see "Test method A" as described below), preferably in the range of from 0 to 0.1%, ($\beta$) The moisture resistance has a value of not more than 5% capillary wedge lift, for example in the range of from 0 to 5% (see "Test method B" as described below), preferably in the range of from 0 to 0.1%, ($\gamma$) The resistivity of the wire is less than 4.0 μΩ·cm, for example in the range of from 1.6 to 4.0 μΩ·cm, preferably in the range of from 1.63 to 3.4 μΩ·cm (see "Test method C" as described below), ($\delta$) The wire's silver dendritic growth is not more than 12 μm/s, for example in the range of from 0 to 12 μm/s, preferably in the range of from 0 to 2 μm/s (see "Test method D" as described below), (ε) The hardness of the wire core is not more than 80 HV (10 mN/12 s), for example in the range of from 50 to 80 HV, preferably in the range of from 50 to 70 HV (see "Test method E" as described below), (ζ) The process window area for $1^{st}$ capillary wedge bonding ($1^{st}$ wedge) has a value of at least 200 mA·g, for example 400 to 600 mA·g for a wire of 17.5 μm in diameter which has been capillary wedge bonded to an Al-0.5 wt.-% Cu bond pad (see "Test method F" as described below), (η) The process window area for $2^{nd}$ stitch bonding ($2^{nd}$ wedge) has a value of at least 50 mA·g, for example 125 to 175 mA·g for a wire of 17.5 μm in diameter stitch bonded to a gold finger (see "Test method G" as described below), (θ) The yield strength of the wire is not more than 170 MPa, for example in the range of from 140 to 170 MPa (see "Test method H" as described below).

The term "extrinsic property" is used herein with regard to a wire core. Extrinsic properties depend on the wire core's relationship with other factors like a measuring method and/or measuring conditions employed, while intrinsic properties mean properties which a wire core has of itself (independently of other factors).

The wire used in the process of the invention has the unexpected advantage that it allows for capillary wedge bonding with a remarkably wide capillary wedge bonding process window. The wire can be made by a process comprising at least the steps (i) to (v):

(i) providing a precursor item consisting of pure silver or of doped silver or of a silver alloy, (ii) elongating the precursor item to form an elongated precursor item, until an intermediate cross-section in the range of from 7850 to 49000 μm² or an intermediate diameter in the range of from 100 to 250 μm, preferably 130 to 140 μm is obtained, (iii) depositing a double-layered coating of an inner layer (base layer) of nickel or palladium and an adjacent outer layer (top layer) of gold on the surface of the elongated precursor item obtained after completion of process step (ii), (iv) further elongating the coated precursor item obtained after completion of process step (iii) until a desired final cross-section or diameter is obtained, and (v) finally strand annealing the coated precursor obtained after completion of process step (iv) at an oven set temperature in the range of from 200 to 600° C. for an exposure time in the range of from 0.4 to 0.8 seconds to form the wire.

The term "strand annealing" is used herein. It is a continuous process allowing for a fast production of a wire with high reproducibility. In the context of the invention, strand annealing means that the annealing is done dynamically while the coated precursor to be annealed is pulled or moved through a conventional annealing oven and spooled onto a reel after having left the annealing oven. Here, the annealing oven is typically in the form of a cylindrical tube of a given length. With its defined temperature profile at a given annealing speed which may be chosen in the range of, for example, from 10 to 60 meters/minute the annealing time/oven temperature parameters can be defined and set.

The term "oven set temperature" is used herein. It means the temperature fixed in the temperature controller of the annealing oven.

This disclosure distinguishes between precursor item, elongated precursor item, coated precursor item, coated precursor and coated wire. The term "precursor item" is used for those wire pre-stages which have not reached the desired final cross-section or final diameter of the wire core, while the term "precursor" is used for a wire pre-stage at the desired final cross-section or the desired final diameter. After completion of process step (v), i.e. after the final strand annealing of the coated precursor at the desired final cross-section or the desired final diameter a wire is obtained which can be used in the process of the invention.

The precursor item as provided in process step (i) may consist of pure silver. Typically, such precursor item is in the form of a rod having a diameter of, for example, 2 to 25 mm and a length of, for example, 2 to 100 m. Such silver rod can be made by continuous casting silver using an appropriate mold, followed by cooling and solidifying.

In the alternative, the precursor item as provided in process step (i) may consist of doped silver or of a silver alloy. Such precursor items can be obtained by alloying, doping or alloying and doping silver with the desired amount of the required components. The doped silver or silver alloy can be prepared by conventional processes known to the person skilled in the art of metal alloys, for example, by melting together the components in the desired proportional ratio. In doing so, it is possible to make use of one or more conventional master alloys. The melting process can for example be performed making use of an induction furnace and it is expedient to work under vacuum or under an inert gas atmosphere. The melt so-produced can be cooled to form a homogeneous piece of silver based precursor item. Typically, such precursor item is in the form of a rod having a diameter of, for example, 2 to 25 mm and a length of, for example, 2 to 100 m. Such rod can be made by continuous casting said doped silver or (doped) silver alloy melt using an appropriate mold, followed by cooling and solidifying.

In process step (ii) the precursor item is elongated to form an elongated precursor item, until an intermediate cross-section in the range of from 7850 to 49000 μm² or an intermediate diameter in the range of from 100 to 250 μm, preferably 130 to 140 μm is obtained. Techniques to elongate a precursor item are known. Preferred techniques are rolling, swaging, die drawing or the like, of which die drawing is particularly preferred. In the latter case the precursor item is drawn in several process steps until the desired intermediate cross-section or the desired intermediate diameter is reached. Such wire die drawing process is well known to the person skilled in the art. Conventional tungsten carbide and diamond drawing dies may be employed and conventional drawing lubricants may be employed to support the drawing.

Step (ii) may include one or more sub-steps of intermediate batch annealing of the elongated precursor item at an oven set temperature in the range of from 400 to 800° C. for an exposure time in the range of from 50 to 150 minutes. The intermediate batch annealing may be performed, for example, with a rod drawn to a diameter of about 2 mm and coiled on a drum.

The optional intermediate batch annealing of process step (ii) may be performed under an inert or reducing atmosphere. Numerous types of inert atmospheres as well as reducing atmospheres are known in the art and are used for purging the annealing oven. Of the known inert atmospheres, nitrogen or argon is preferred. Of the known reducing atmospheres, hydrogen is preferred. Another preferred reducing atmosphere is a mixture of hydrogen and nitrogen. Preferred mixtures of hydrogen and nitrogen are 90 to 98 vol.-% nitrogen and, accordingly, 2 to 10 vol.-% hydrogen, wherein the vol.-% total 100 vol.-%. Preferred mixtures of nitrogen/hydrogen are equal to 90/10, 93/7, 95/5 and 97/3 vol.-%/vol.-%, each based on the total volume of the mixture.

In process step (iii) a double-layered coating comprised of an inner layer of nickel or palladium and an adjacent outer layer of gold is deposited on the surface of the elongated precursor item obtained after completion of process step (ii) so as to superimpose the coating over said surface.

The skilled person knows how to calculate the thickness of such coating on an elongated precursor item to finally obtain the coating in the layer thickness disclosed for the embodiments of the wire, i.e. after finally elongating the coated precursor item. The skilled person knows numerous techniques for forming a coating layer of a material according to the embodiments on a silver or silver alloy surface. Preferred techniques are plating, such as electroplating and electroless plating, deposition of the material from the gas phase such as sputtering, ion plating, vacuum evaporation and physical vapor deposition, and deposition of the material from the melt. Electroplating is the preferred technique.

In process step (iv) the coated precursor item obtained after completion of process step (iii) is further elongated until the desired final cross-section or diameter of the wire is obtained. Techniques to elongate the coated precursor item are the same elongation techniques like those mentioned above in the disclosure of process step (ii).

In process step (v) the coated precursor obtained after completion of process step (iv) is finally strand annealed at an oven set temperature in the range of from 200 to 600° C., preferably 200 to 400° C. for an exposure time in the range of from 0.4 to 0.8 seconds to form the coated wire.

In a preferred embodiment, the finally strand annealed coated precursor, i.e. the still hot coated wire is quenched in water which, in an embodiment, may contain one or more additives, for example, 0.01 to 0.07 volume-% of additive(s). The quenching in water means immediately or rapidly, i.e. within 0.2 to 0.6 seconds, cooling the finally strand annealed coated precursor from the temperature it experienced in process step (v) down to room temperature, for example by dipping or dripping.

After completion of process step (v) and the optional quenching the coated wire is finished. In order to fully benefit from its properties, it is expedient to either use it immediately for wire bonding applications, i.e. without delay, for example, within no longer than 28 days after completion of process step (v).

In step (2) of the process of the invention the capillary wedge bonded wire is raised so as to form a wire loop between the capillary wedge bond formed in step (1) and the contact surface of the second electronic component. Bonding wire loop formation with a desired loop shape and a desired loop process profile (capillary motion) is performed in a conventional manner known to the person skilled in the art and therefore it does not require a detailed explanation. It may be worked according to the procedures described in the KNS Process User Guide for looping profile (Kulicke & Soffa Industries Inc., Fort Washington, PA, USA, 2002). Loop shape and loop process profile may be determined by adjusting looping parameters like, for example, kink height, reverse motion, kink distance, kink angle, loop factor, shape angle, span length, last-kink angle and/or last-kink length. Examples of loop process profiles include Standard Loop, Worked-Loop, BGA2-Loop, BGA3-Loop, BGA4-Loop, BGA5-Loop, K-Loop, PSA-Loop, ULL-Loop.

In step (3) of the process of the invention the bonding wire is stitch bonded to the contact surface of the second electronic component. The stitch bonding procedure of step (3) as such is well-known to the person skilled in the art and comprises no methodological peculiarities. A usual stitch bonding equipment or stitch bonding tool can be used. It may be worked according to the procedures described in the KNS Process User Guide for stand-off stitch bond (SSB) (Kulicke & Soffa Industries Inc., Fort Washington, PA, USA, 2003). Stitch bonding process parameters may be, for example: bonding force in the range of, for example, 5 to 500 g; ultrasonic energy in the range of, for example, 5 to 200 mA; temperature in the range of, for example, 25 to 250° C.; constant velocity in the range of, for example, 2.5 to 40 µm/ms; bonding time in the range of, for example, 3 to 30 ms.

As already mentioned, steps (1) to (3) of the process of the invention are subsequent steps. However, there may be one or more further minor steps, for example, steps taking place prior to, in between or after the step sequence (1) to (3).

In an embodiment of the process of the invention, the first electronic component is a substrate having a contact surface or a semiconductor having a contact surface in the form of a bond pad and the second electronic component is a substrate having a contact surface or a semiconductor having a contact surface in the form of a bond pad. In a first variant of said embodiment, the first electronic component is a semiconductor having a contact surface in the form of a bond pad and the second electronic component is a substrate having a contact surface. In a second variant of said embodiment, the first electronic component is a substrate having a contact surface and the second electronic component is a semiconductor having a contact surface in the form of a bond pad.

EXAMPLES

Test Methods A. to H.

All tests and measurements were conducted at T=20° C. and a relative humidity RH=50%.

A. Salt-Solution Soaking Test of Capillary Wedge Bonds:

The wires were capillary wedge bonded to Al-0.5 wt.-% Cu bond pads. The test devices with the so-bonded wires were soaked in salt-solution at 25° C. for 10 minutes, washed with deionized (DI) water and later with acetone. The salt-solution contained 20 wt.-ppm NaCl in DI water. The number of lifted wedge bonds were examined under a low power microscope (Nikon MM-40) at 100× magnification. Observation of a higher number of lifted capillary wedge bonds indicated severe interfacial galvanic corrosion.

B. Moisture Resistance Test of Capillary Wedge Bonds:

The wires were capillary wedge bonded to Al-0.5 wt.-% Cu bond pads. The test devices with the so-bonded wires were stored at 130° C. temperature, 85% relative humidity (RH) for 8 hours in a highly accelerated stress test (HAST) chamber and later examined for the number of lifted wedge bonds under a low power microscope (Nikon MM-40) at 100× magnification.

Observation of a higher number of lifted capillary wedge bonds indicated severe interfacial galvanic corrosion.

C. Electrical Resistivity:

Both ends of a test specimen, i.e. a wire of 1.0 meter in length, were connected to a power source providing a constant current/voltage. The resistance was recorded with a device for the supplied voltage. The measuring device was a HIOKI model 3280-10, and the test was repeated with at least 10 test specimens. The arithmetic mean of the measurements was used for the calculations given below.

The resistance R was calculated according to R=V/I.

The specific resistivity $\rho$ was calculated according to $\rho=(R \times A)/L$, wherein A is the mean cross-sectional area of the wire and L the length of the wire between the two measuring points of the device for measuring the voltage.

The specific electrical conductivity $\sigma$ was calculated according to $\sigma=1/\rho$.

D. Electro-Migration Test of Wires:

Two wires of 75 μm diameter were kept parallel within a millimeter distance on a glass plate under the objective lens of a low power microscope Nikon MM40 model at 50× magnification. A water drop was formed by a micropipette between the two wires to be connected electrically. One wire was connected to a positive and the other to a negative pole and +5 V was given to the wires. The two wires were biased with +5 V direct current in a closed circuit, connected in series with a 10 kΩ resistor. The circuit was closed by wetting the two wires with a few drops of de-ionized water as an electrolyte. Silver electro-migrated from the cathode to the anode in the electrolyte forming silver dendrites, sometimes the two wires bridged. The rate of growth of silver dendrites strongly depended on the wires' coating layer and—in case of a silver alloy wire core—the alloying additions.

E. Vickers Micro-Hardness:

The hardness was measured using a Mitutoyo HM-200 testing equipment with a Vickers indenter. A force of 10 mN indentation load was applied to a test specimen of wire for a dwell time of 12 seconds. The testing was performed on the center of the wire or the FAB.

F. Capillary Wedge Bonding (1$^{st}$ Wedge) Process Window Area:

Measurements of the capillary wedge bonding process window area were done by a standard procedure. The test wires were capillary wedge bonded to a Al-0.5 wt % Cu bond pad of a silicon die using a KNS-iConn bonder tool (Kulicke & Soffa Industries Inc., Fort Washington, PA, USA). The vital capillary wedge bonding process parameters were: ultrasonic energy of 75 mA, compressive force of 20 g, constant velocity of 0.5 μm/s, contact threshold of 65%, bonding temperature of 150° C., tail length extension of 350 μm, ultrasonic ramp of 25%. The process window values were based on a wire having an average diameter of 17.5 μm.

The four corners of the process window were derived by overcoming the two main failure modes:

(1) supply of too low force and ultrasonic energy lead to non-stick on pad (NSOP) of the wire, and (2) supply of too high force and ultrasonic energy lead to short wire tail (SHTL).

G. Stitch Bonding (2$^{nd}$ Wedge) Process Window Area:

Measurements of the stitch bonding process window area were done by a standard procedure. The test wires were stitch bonded to a gold plated lead finger on a BGA (ball grid array) substrate using a KNS-iConn bonder tool (Kulicke & Soffa Industries Inc., Fort Washington, PA, USA). The process window values were based on a wire having an average diameter of 17.5 μm.

The four corners of the process window were derived by overcoming the two main failure modes:

(1) supply of too low force and ultrasonic energy lead to non-stick on lead finger (NSOL) of the wire, and (2) supply of too high force and ultrasonic energy lead to short wire tail (SHTL).

H. Elongation (EL):

The tensile properties of the wires were tested using an Instron-5564 instrument. The wires were tested at 2.54 cm/min speed, for 254 mm gauge length (L). The load and elongation on fracture (break) were acquired as per ASTM standard F219-96. The elongation was the difference in the gauge length ($\Delta L$) of the wire between start and end of the tensile test, usually reported in percentage as (100·$\Delta L$/L), calculated from the recorded load versus extension tensile plot. The tensile strength and the yield strength were calculated from the break and yield load divided by the wire area. The actual diameter of the wire was measured by the sizing method, weighing a standard length of the wire and using the density of it.

Wire Samples 1 to 12

A quantity of silver (Ag), palladium (Pd) and gold (Au) of at least 99.99% purity ("4N") in each case were melted in a crucible. Small amounts of silver-nickel, silver-calcium, silver-platinum or silver-copper master alloys were added to the melt and uniform distribution of the added components was ascertained by stirring. The following master alloys were used:

| Master Alloy | Composition | |
|---|---|---|
| Ag-0.5 wt.-% Ni | 99.5 wt.-% Ag | 0.5 wt.-% Ni |
| Ag-0.5 wt.-% Ca | 99.5 wt.-% Ag | 0.5 wt.-% Ca |
| Ag-0.5 wt.-% Pt | 99.5 wt.-% Ag | 0.5 wt.-% Pt |
| Ag-0.5 wt.-% Cu | 99.5 wt.-% Ag | 0.5 wt.-% Cu |

For the alloys of Table 1 the corresponding combination of master alloys were added.

Then a wire core precursor item in the form of 8 mm rods was continuous cast from the melt. The rods were then drawn in several drawing steps to form a wire core precursor having a circular cross-section with a diameter of 134 μm. The wire core precursor was intermediate batch annealed at an oven set temperature of 500° C. for an exposure time of 60 minutes and then electroplated with a double layer coating consisting of an inner palladium (or nickel) layer and an outer gold layer and thereafter further drawn to a final diameter of 17.5 μm and a final palladium or nickel layer thickness within the range of 1 to 4 nm and a final gold layer thickness within the range of 10 to 18 nm, followed by a final strand annealing at an oven set temperature of 220° C. for an exposure time of 0.6 seconds, immediately followed by quenching the so-obtained coated wires in water containing 0.07 vol.-% of surfactant.

By means of this procedure, several different samples 1 to 12 of coated silver and silver-based wires and an uncoated reference silver wire of 4N purity (Ref) were manufactured. Table 1 shows the composition of wires having a diameter of 17.5 μm. The composition was determined by ICP.

TABLE 1

| | Coating contribution of the coating's constituents in wt.-% of coated wire | | | Core Chemistry | | | | | Total Au + Pd wt.-% of coated wire |
|---|---|---|---|---|---|---|---|---|---|
| | | | | wt.-ppm | | | wt.-% | | |
| Sample | Au | Pd | Ni | Ni | Ca | Pt | Au | Pd | |
| 4N Ag (Ref) | — | — | — | 2 | 2 | 2 | 0.0002 | 0.0002 | — |
| 1 | 0.5 | 0.05 | — | 2 | 2 | 2 | 1 | 1 | 2.55 |
| 2 | 0.5 | 0.05 | — | 2 | 2 | 2 | 1 | 3 | 4.55 |
| 3 | 0.5 | 0.05 | — | 2 | 30 | 2 | 1 | 3 | 4.55 |
| 4 | 0.5 | 0.05 | — | 10 | 20 | 10 | 1 | 3 | 4.55 |
| 5 | 1 | 0.05 | — | 2 | 2 | 2 | 1 | 3 | 5.05 |
| 6 | 1 | 0.05 | — | 2 | 2 | 2 | 1 | 3 | 5.05 |
| 7 | 0.5 | — | 0.04 | 2 | 2 | 2 | 1 | 1 | 2.5 |
| 8 | 0.5 | — | 0.04 | 2 | 2 | 2 | 1 | 3 | 4.5 |
| 9 | 0.5 | — | 0.04 | 2 | 30 | 2 | 1 | 3 | 4.5 |
| 10 | 0.5 | — | 0.04 | 10 | 20 | 10 | 1 | 3 | 4.5 |
| 11 | 1 | 0.05 | — | 2 | 2 | 2 | 1 | 3 | 5.05 |
| 12 | 1 | 0.1 | — | 2 | 2 | 2 | 1 | 3 | 5.1 |

Table 2 below shows certain test results. All tests were carried out with wires having a diameter of 17.5 μm, except for the electro-migration test which was performed with wires of 75 μm diameter.

TABLE 2

| | | Sample | | | | | | | | | | | |
|---|---|---|---|---|---|---|---|---|---|---|---|---|---|
| | | Ref | 1 | 2 | 3 | 4 | 5 | 6 | 7 | 8 | 9 | 10 | 11 | 12 |
| Mechanical properties | Elongation (%) | 7.4 | 4.1 | 4.4 | 4.0 | 3.9 | 3.8 | 4.0 | 4.2 | 4.4 | 4.3 | 4.1 | 4.1 | 4.2 |
| | Tensile strength (MPa) | 183 | 470 | 481 | 485 | 483 | 486 | 481 | 483 | 480 | 482 | 484 | 481 | 481 |
| | Yield strength (MPa) | 130 | 270 | 275 | 292 | 278 | 275 | 282 | 280 | 275 | 291 | 283 | 283 | 281 |
| | Micro-hardness, HV (10 mN/12 s) | 58 | 70 | 76 | 80 | 80 | 71 | 73 | 72 | 75 | 80 | 78 | 73 | 72 |
| Electrical properties | Resistivity (μΩ · cm) | 1.6 | 3.31 | 3.32 | 3.32 | 3.32 | 3.32 | 3.31 | 3.32 | 3.32 | 3.32 | 3.32 | 3.32 | 3.32 |
| Salt-solution soaking test | % capillary wedge lift | 80 | 1 | 0 | 0 | 0 | 0 | 0 | 1 | 0 | 0 | 0 | 0 | 0 |
| Moisture resistance test | % capillary wedge lift | 50 | 2 | 0 | 0 | 0 | 0 | 0 | 1 | 0 | 0 | 0 | 0 | 0 |
| Electro-migration test | Rate of growth of silver dendrites (μm/s) | 25 | 0 | 0 | 0 | 0 | 0 | 0 | 0 | 0 | 0 | 0 | 0 | 0 |
| Bonding process window | 1st bond (capillary wedge bond) (mA · g) | 50 | 250 | 440 | 440 | 430 | 430 | 410 | 390 | 500 | 450 | 440 | 440 | 400 |
| | 2nd bond (stitch bond) (mA · g) | 225 | 75 | 140 | 130 | 130 | 130 | 130 | 125 | 150 | 135 | 135 | 135 | 130 |

The invention claimed is:

1. A process for electrically connecting a contact surface of a first electronic component with a contact surface of a second electronic component comprising the subsequent steps:

(1) capillary wedge bonding a wire having a circular cross-section with an average diameter in the range of 8 to 80 μm to the contact surface of the first electronic component, (2) forming a wire loop between the capillary wedge bond formed in step (1) and the contact surface of the second electronic component, and (3) stitch bonding the wire to the contact surface of the second electronic component, wherein the capillary wedge bonding of step (1) is carried out with a ceramic capillary having a face angle within the range of from zero to 4 degrees, wherein the wire comprises a wire core with a surface, the wire core having a double-layered coating superimposed on its surface, wherein the wire core consists of a material selected from the group consisting of pure silver, doped silver with a silver content of >99.5 wt. % and silver alloys with a silver content of at least 89 wt. %, and wherein the double-layered coating comprises a 1 to 50 nm thick inner layer of nickel or palladium and an adjacent 5 to 200 nm thick outer layer of gold.

2. The process of claim 1, wherein parameters for the capillary wedge bonding of step (1) include at least one of (a') to (g'):
(a') an ultrasonic energy in a range of 50 to 100 mA,
(b') a force in a range of 10 to 30 g,
(c') a constant velocity in a range of 0.3 to 0.7 μm/s,
(d') a contact threshold in a range of 60 to 70%,
(e') a bonding temperature in a range of 25 to 175° C.,
(f') a tail length extension in a range of 200 to 500 μm,
(g') an ultrasonic ramp in a range of 0 to 50%.

3. The process of claim 1, wherein the wire core consists of pure silver consisting of 99.95 to 100 wt. % of silver and up to 500 wt. ppm of further components other than silver.

4. The process of claim 1, wherein the wire core consists of a doped silver which consists of >99.5 to 99.997 wt. % of silver, 30 to <5000 wt. ppm of at least one doping element and up to 500 wt.-ppm of further components other than silver and the at least one doping element.

5. The process of claim 1, wherein the wire core consists of a silver alloy which consists of 89 to 99.50 wt. % of silver, 0.50 to 11 wt. % of at least one alloying element, up to <5000 wt. ppm of at least one doping element and up to 500 wt. ppm of further components other than silver, the at least one alloying element and the at least one doping element.

6. The process of claim 5, wherein the at least one alloying element is selected from the group consisting of palladium, gold, nickel, platinum, copper, rhodium and ruthenium.

7. The process of claim 5, wherein the at least one doping element is selected from the group consisting of calcium, nickel, platinum, copper, rhodium and ruthenium.

8. The process of claim 1, wherein the first electronic component is a substrate having a contact surface or a semiconductor having a contact surface in the form of a bond pad and the second electronic component is a substrate having a contact surface or a semiconductor having a contact surface in the form of a bond pad.

9. The process of claim 8, wherein the first electronic component is a semiconductor having a contact surface in the form of a bond pad and the second electronic component is a substrate having a contact surface.

10. The process of claim 8, wherein the first electronic component is a substrate having a contact surface and the second electronic component is a semiconductor having a contact surface in the form of a bond pad.

11. The process of claim 2, wherein the wire core consists of a doped silver which consists of >99.5 to 99.997 wt. % of silver, 30 to <5000 wt. ppm of at least one doping element and up to 500 wt. ppm of further components other than silver and the at least one doping element.

12. The process of claim 2, wherein the wire core consists of a silver alloy which consists of 89 to 99.50 wt. % of silver, 0.50 to 11 wt. % of at least one alloying element, up to <5000 wt. ppm of at least one doping element and up to 500 wt. ppm of further components other than silver, the at least one alloying element and the at least one doping element.

13. The process of claim 12, wherein the at least one alloying element is selected from the group consisting of palladium, gold, nickel, platinum, copper, rhodium and ruthenium.

14. The process of claim 12, wherein the at least one doping element is selected from the group consisting of calcium, nickel, platinum, copper, rhodium and ruthenium.

15. The process of claim 1, wherein parameters for the capillary wedge bonding of step (1) include at least one of (a") to (h"):
(a") an ultrasonic energy in a range of 50 to 100 mA,
(b") a force in a range of 10 to 30 g,
(c") a constant velocity in a range of 0.3 to 0.7 μm/s,
(d") a contact threshold in a range of 60 to 70%,
(e") a bonding temperature in a range of 25 to 175° C.,
(f") a cut tail length in a range of 85 to 110 μm,
(g") a sink amount in a range of −6 to −12 μm,
(h") an ultrasonic sloping in a range of 0 to 50%.

16. The process of claim 15, wherein the wire core consists of a doped silver which consists of >99.5 to 99.997 wt. % of silver, 30 to <5000 wt. ppm of at least one doping element and up to 500 wt.-ppm of further components other than silver and the at least one doping element.

17. The process of claim 15, wherein the wire core consists of a silver alloy which consists of 89 to 99.50 wt. % of silver, 0.50 to 11 wt. % of at least one alloying element, up to <5000 wt. ppm of at least one doping element and up to 500 wt. ppm of further components other than silver, the at least one alloying element and the at least one doping element.

18. The process of claim 17, wherein the at least one alloying element is selected from the group consisting of palladium, gold, nickel, platinum, copper, rhodium and ruthenium.

19. The process of claim 17, wherein the at least one doping element is selected from the group consisting of calcium, nickel, platinum, copper, rhodium and ruthenium.

* * * * *